(12) United States Patent
Parthasarathy et al.

(10) Patent No.: US 9,021,342 B2
(45) Date of Patent: Apr. 28, 2015

(54) METHODS TO IMPROVE ACS PERFORMANCE

(75) Inventors: Sivagnanam Parthasarathy, Carlsbad, CA (US); Lun Bin Huang, San Diego, CA (US)

(73) Assignee: STMicroelectronics, Inc., Coppell, TX (US)

( * ) Notice: Subject to any disclaimer, the term of this patent is extended or adjusted under 35 U.S.C. 154(b) by 292 days.

(21) Appl. No.: 12/924,658

(22) Filed: Oct. 1, 2010

(65) Prior Publication Data

US 2011/0167322 A1 Jul. 7, 2011

Related U.S. Application Data

(60) Provisional application No. 61/247,908, filed on Oct. 1, 2009.

(51) Int. Cl.
*H03M 13/03* (2006.01)
*H03M 13/41* (2006.01)

(52) U.S. Cl.
CPC ...... *H03M 13/4146* (2013.01); *H03M 13/4107* (2013.01)

(58) Field of Classification Search
CPC ............ H04B 1/71057; H04B 1/7117; H04L 25/0212; H04L 25/025; H04L 25/03178; H04L 1/0014; H04L 1/0019; H04L 1/0045; H04L 1/0057; H04L 1/006; H04L 1/0065; H04L 1/007; H04L 1/0071; H04L 2025/03382; H04L 2025/03598; H04L 2027/004; H04L 2027/0055; H04L 2027/0081; H04L 25/0307; H04L 27/04; H04L 27/066; H04L 7/0004; H04L 7/0062; H04L 7/0278; H04H 20/28; H04H 20/57
USPC ........... 714/795, 796, 792; 708/318; 704/242; 375/E1.028, E1.032, 148, 262, 341; 370/320
See application file for complete search history.

(56) References Cited

U.S. PATENT DOCUMENTS

| 4,989,170 | A  * | 1/1991  | Batruni et al. ................. 708/322 |
| 6,622,283 | B1 * | 9/2003  | Cohen ........................... 714/794 |
| 6,711,218 | B2 * | 3/2004  | Dent ............................. 375/341 |
| 2003/0118093 | A1 * | 6/2003 | Bohnhoff et al. ............. 375/229 |
| 2004/0057535 | A1 * | 3/2004 | Strolle et al. .................. 375/340 |
| 2004/0267519 | A1 * | 12/2004 | Sjoberg et al. ................ 704/201 |
| 2005/0066259 | A1 * | 3/2005 | Park et al. ..................... 714/795 |
| 2005/0226315 | A1 * | 10/2005 | Yen ................................ 375/232 |
| 2006/0062284 | A1 * | 3/2006 | Li et al. ........................ 375/148 |
| 2008/0052607 | A1 * | 2/2008 | Sato ............................... 714/795 |
| 2011/0317612 | A1 * | 12/2011 | Kim et al. ..................... 370/312 |

OTHER PUBLICATIONS

Jones, N., "A tutorial on signed and unsigned integers," Aug. 5, 2009, accessed Jan. 27, 2015 at http://embeddedgurus.com/stack-overflow/2009/08/a-tutorial-on-signed-and-unsigned-integers, 3 pgs.

* cited by examiner

*Primary Examiner* — Guy Lamarre
(74) *Attorney, Agent, or Firm* — Seed IP Law Group PLLC

(57) ABSTRACT

In one embodiment, systems and methods of operating a SOVA system is disclosed that comprises determining the start and stop values for a trellis tree and using the start and stop values to determine the initial states of a plurality of branches within the trellis tree.

11 Claims, 2 Drawing Sheets

TIZIANO VS. ARES APRIORI ADJUSTMENT EQUIVALENCE

| ap(k) | DEST | SM | SIGNED INTEGERS USED | UNSIGNED | NOTE |
|---|---|---|---|---|---|
| >0 | (2i) | sm(i)<br>sm(i+4) | sm(i)+bm(i)−lap(k)<br>sm(i+4)+bm(i+4)−lap(k) | sm(i)+bm(i)<br>sm(i+4)+bm(i+4) | EQUIVALENT TO ADDING +lapk| TO ALL THE TIZIANO STATE METRICS WHEN apk>0 |
|  | (2i+1) | sm(i)<br>sm(i+4) | sm(i)+bm(i)<br>sm(i+4)+bm(i+4)+lap(k) | sm(i)+bm(i)+lap(k)<br>sm(i+4)+bm(i+4)+lap(k) |  |
| <0 | (2i) | sm(i)<br>sm(i+4) | sm(i)+bm(i)<br>sm(i+4)+bm(i+4)+lap(k) | sm(i)+bm(i)+lap(k)<br>sm(i+4)+bm(i+4)+lap(k) | NO ADJUSTMENT TO ARES STATE METRICS WHEN apk<0 |
|  | (2i+1) | sm(i)<br>sm(i+4) | sm(i)+bm(i)<br>sm(i+4)+bm(i+4) | sm(i)+bm(i)<br>sm(i+4)+bm(i+4) |  |

*FIG. 4*

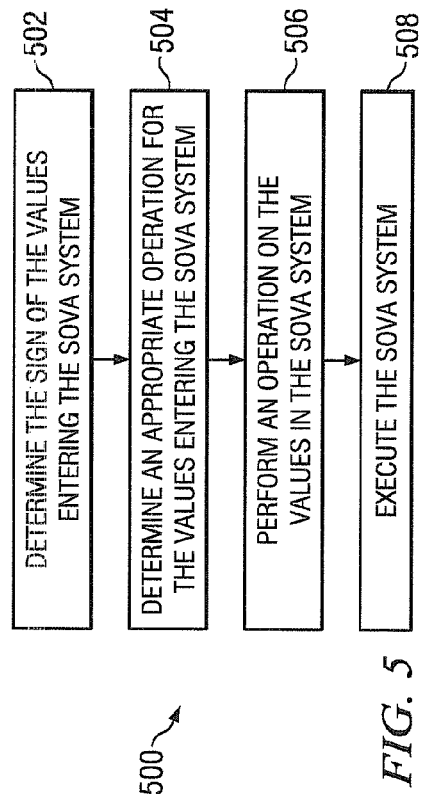

*FIG. 5*

METHODS TO IMPROVE ACS PERFORMANCE

CROSS-REFERENCE TO RELATED APPLICATIONS AND CLAIM OF PRIORITY

The present application is related to U.S. Provisional patent Application No. 61/247,908, filed Oct. 1, 2009, entitled "METHODS TO IMPROVE ACS PERFORMANCE". Provisional Patent Application No. 61/247,908 is assigned to the assignee of the present application and is hereby incorporated by reference into the present application as it fully set forth herein. The present application hereby claims priority under 35 U.S.C. §119(e) to U.S. Provisional Patent Application No. 61/247,908.

TECHNICAL FIELD OF THE INVENTION

The present invention generally relates to various electronic systems, and more specifically to implementations of soft output viterbi algorithm (SOVA), and more specifically to improving the performance of various electronic systems that utilize SOVA.

BACKGROUND OF THE INVENTION

The soft output Viterbi algorithm (SOVA) is a variation of the classical Viterbi algorithm. The Viterbi algorithm is a programming algorithm for finding the Viterbi path (e.g., most likely sequence of hidden states) that result in a particular sequence of events. The forward algorithm is a closely related algorithm for computing the probability of a sequence of events.

The Viterbi algorithm makes a number of assumptions. First, both the observed events and hidden events must be in a sequence. Second, these two sequences need to be aligned, and an instance of an observed event needs to correspond to exactly one instance of a hidden event. Third, computing the most likely hidden sequence up to a certain point t must depend only on the observed event at point t, and the most likely sequence at point t−1.

The terms "Viterbi path" and "Viterbi algorithm" are also applied to related dynamic programming algorithms that discover the single most likely explanation for an observed event. For example, in statistical parsing, a dynamic programming algorithm can be used to discover the single most likely context-free derivation (parse) of a string, which is sometimes called the "Viterbi parse".

SOVA differs from the classical Viterbi algorithm in that SOVA uses a modified path metric that takes into account the a priori probabilities of the input symbols, and produces a soft output indicating the reliability of the decision. In some implementations of SOVA, the first step is the selection of the survivor path, passing through one unique node at each time instant, t. It is known that since each node has 2 branches converging at it (with one branch being chosen to form the Survivor Path, and the other being discarded), the difference in the branch metrics (or cost) between the chosen and discarded branches indicate the amount of error in the choice. This cost is accumulated over the entire sliding window (usually equals at least five constraint lengths), to indicate the soft output measure of reliability of the hard bit decision of the Viterbi algorithm.

The traditional SOVA computes a log-likelihood ratio (LLR) as the minimum difference between the log of the probability of the path leading to a 0 or 1 decision and the log of the probability of the path leading to the opposite decision. The log of the probability of the path is represented by a path metric value that is the sum of the state metric and the branch metric at time 'k'.

The difference between the path metrics is considered only if the best path and its alternate lead to a different decision. In this case, the LLR is computed in the same way as the max-log-map system. By minimizing the path metric difference, one maximizes the probability (path metric) of the path leading to decision 1 versus the path leading to decision 0.

The problem with this approach to the calculation of the LLR within a traditional SOVA is evident when the alternate path leads to the same decision as the best path. In this case, the traditional SOVA does consider the path metric difference in updating the reliability information.

Implementations that generate max-log-map equivalence LLR that do not compromise on performance are needed.

SUMMARY OF THE INVENTION

In one embodiment, a method of operating a SOVA system is disclosed that comprises determining start and stop values for a trellis tree and using the start and stop values to determine the initial states of a plurality of branches within a trellis tree.

In another embodiment, a method of using unsigned values in a SOVA system is disclosed. This method includes determining the value of a number that is entering at least one trellis tree, altering the number through the use of at least one offset, and processing a plurality of values within the trellis tree by comparing the values of pairs of values.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

Preferred embodiments according to the present invention will now be described with reference to the Figures, in which like reference numerals denote like elements.

FIG. 2 is a table illustrating various elements of the use of a SOVA system according to one embodiment of the present disclosure;

FIG. 4 is a table illustrating the use of a unsigned value according to one embodiment of the present disclosure; and FIG. 5 is a flowchart of one method of using unsigned values in a SOVA system, according to one embodiment of the present disclosure.

DETAILED DESCRIPTION OF THE INVENTION

Figure 1:
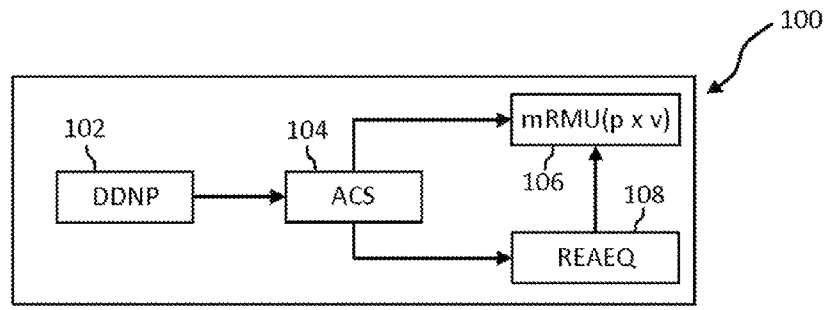
FIG. 1 is a block diagram of a SOVA system according to one embodiment of the present disclosure.

Definitions for certain words and phrases are provided throughout this patent document, those of ordinary skill in the art should understand that in many, if not most instances, such definitions apply to prior, as well as future uses of such defined words and phrases.

While this detailed description has set forth some embodiments of the present disclosure, the appended claims are sufficiently supported to cover and will cover other embodiments of the present invention which differ from the described embodiments according to various modifications and improvements.

The Soft Output Viterbi Algorithm (SOVA) can contain a collection of SOVA components and wrappers. The logic of the SOVA Core is stripped down to bare data-path and control for the equalized sample processing and LLR generation. Other components are optionally included in individual SOVA instantiations. For example, the primary SOVA block (SOVA1) may need to preserve the equalized samples and pass them to the iterative block along with the log-likelihood ratios (LLR), while the secondary SOVA block (SOVA2) in the iterative system may instead need to buffer the apriori's for extrinsic LLR generation. The updating and storing of the configuration coefficients for the detector may also be different for each of the instantiations. For the purpose of clarity, a block model that can be used consistent with a plurality of SOVA instantiations will be disclosed herein.

Systems and methods are disclosed herein that provide implementations for generating max-log-map equivalence LLRs that do not compromise on performance and is attractive in terms of a simple application programming language over a traditional SOVA.

In one embodiment of the present disclosure, the critical path of an element, such as an add-compare-selector (ACS), is optimized using the apriori information. A multiplexer is required to be added to the ACS critical path to set the branch state of the ACS. The requirement for a multiplexer in an ACS critical path increases the complexity and computation cost of the ACS operations. In one embodiment, the requirement for this multiplexer to be present is removed by managing branch metrics so that it is guaranteed that the state metric 0 is the "winner". This management is performed through apriori information relating to either or both the state and end states of the trellis tree used in the SOVA system. Through this branch manipulation, the requirement for a multiplexer to be part of the critical path of the ACS is removed. This may be particularly advantageous as the ACS cannot be pipelined due to the requirement that operations of the ACS may need to be completed within a single cycle.

In another embodiment of the present disclosure, unsigned integers are used in the SOVA system. Data passing through the tree in the SOVA has been simplified by removing a single bit of data indicating the sign of the data through the use of constants. The use constants in a predetermined pattern allows for the simplification of data passing through the tree without altering the results of the tree itself. The constants in effect indicate the sign of the data by altering the result of the comparison two branches. The use of the branch comparison based in part upon the manipulation of the data within the branches to remove the sign of data allows for more efficient data processing.

Information may be used to manipulate the state metric into a particular state. The manipulation of the state metric using apriori information may remove the need for a multiplexer to force the apriori information to a particular state. In prior art methods, the SOVA required a multiplexer to be placed in the ACS critical path. It is difficult to pipeline data within an ACS unit, as the ACS must perform an operation with all of the necessary information within a single cycle. By manipulating the apriori information, the need for a multiplexer in the critical path of the ACS may be removed.

FIG. 1 is an example of a SOVA system 100 using the presently disclosed systems and methods. FIG. 1 illustrates a Data Dependant Noise Prediction (DDNP) 102, an Add-Compare-Select (ACS) 104, a reliability metric unit (RMU) 106 p×v, and a register exchange equivalency check logic REAEQ 108. The SOVA system 100 is made up of three data-path components, namely a DDNP, an ACS and an RMU, and a data flow control block, sova_ctrl. Equalized data flow into DDNP 102 coming out as branch metrics. ACS 104 produces decisions and path-metric differences from the branch metrics. Finally RMU 106 takes the output from ACS and generates the log-likelihood ratios (LLRs).

DDNP 102 may, in some embodiments, be used to provide filtering of signals prior to the processing of the signal by ACS 104. It is understood that DDNP 102 may be implemented for a plurality of purposes, and implemented through a plurality of devices. These devices may include, but are not limited to, a filtering device. DDNP 102 may further perform the noise whitening (through eight 3-tap FIR filter with polar symmetry coefficients relative to a later branch metric calculation data-path) and Euclidean distance computation (16 branch metric units performing bias subtraction, bitshifting and square function) to produce the branch metric. An ln 2 operation may be added to account for a variance in the Gaussian distribution of the whitened noise. In secondary iterations of an iterative system, an apriori information computed by the decoder during the previous iteration is incorporated into the data-path of the zero-transition pipeline to provide a positive reinforcement to the detector decision and enhance the quality of the detection.

ACS 104 is a module that can comprise an adding unit, a comparator, a selector, and a latch (not shown in FIG. 1). At any time k, a state metric value (M) indicates a cost associated with the best path through the trellis diagram to the state, and is therefore a measure for the likelihood of this particular path. Preferably, the state metric value (M) is stored in a memory device, such as the latch (not shown). If a latch is used to store the state metric value (M), the latch must be able to store g+h binary bits. The adding unit of the ACS 104 adds the branch metric value (Q) for time k+1 for a given state to the state metric value (M) for time k for a given state to obtain a state metric value (M) for time k+1 for a given state. The state metric value (M) for time k is stored in the latch in the ASC 104 and received by the adding unit. The adding unit outputs the state metric value (M) for time k+1 for a given state to the comparator and the selector. Typically, more than one state metric value (M) for time k+1 exists for any given state, and all these value are output by the adding unit. The comparator receives the output of the adding unit containing all the state metric values (M) for time k+1 for a given state and then compares all the state metric values (M) for time k+1 for the given state. The comparator then generates a control input for the selector. Additionally, the comparator outputs a control signal. The selector receives the control input from the comparator and the output from the adding unit containing all the state metric values (M) for time k+1 for a given state, and selects a state metric value (M) for time k+1, which is then stored in the latch. Preferably, the selector selects the largest state metric value (M) for time k+1 for a given state, and outputs that value to the latch.

The basic operation may be used to prune the Viterbi trellis paths. It maintains a set of state metrics that are the best path metrics selected during trellis parsing. At end of each stage, a set of path metric differences for all the states is computed and sent to RMU 106, along with a set of selection decisions.

Following the ACS is the RMU 106. The RMU 106 employs the Viterbi soft-output algorithm with a Fossorier modification to produce the log-likelihood ratio output from the path metric difference and stage decisions. RMU 106 computes the LLR by aggregating the minimum path metric difference computed by ACS and selected by back-tracking the best path. A distributed path memory aggregator REA (register exchange architecture) performs the trellis back-tracking to extract the hard decision. REAEQ 108 (REA equivalence check) replays the REA aggregation (hard decisions) to select the best state for each stage of the REAEQ 108. The aggregated path difference is combined with the hard decision to form a full LLR. In secondary iterative units, the SOVA core needs to adjust this value by subtracting the corresponding apriori produced in prior stages.

The Fossorier modification improves the optimum bit error probability with measurable increment in computation complexity. A trade-off solution is implemented to balance the performance and cost. The first sixteen stages of the aggregation are done with Fossorier modification while the remaining twelve stages may be done in the conventional form.

The SOVA system includes a register exchange architecture (REA) to compute the best path, a path-metric and decision FIFO (PMD-FIFO) reliability metric unit (RMU) along with register exchange equivalency check logic (REAEQ) to track the best path and the alternate path results. Given a path memory depth 'p', RMU depth Y, and number of Viterbi states V, the resources required for SOVA and modified SOVA (mSOVA) generating max-log-map equivalence LLR are shown in the table 200 illustrated in FIG. 2.

Figure 3:
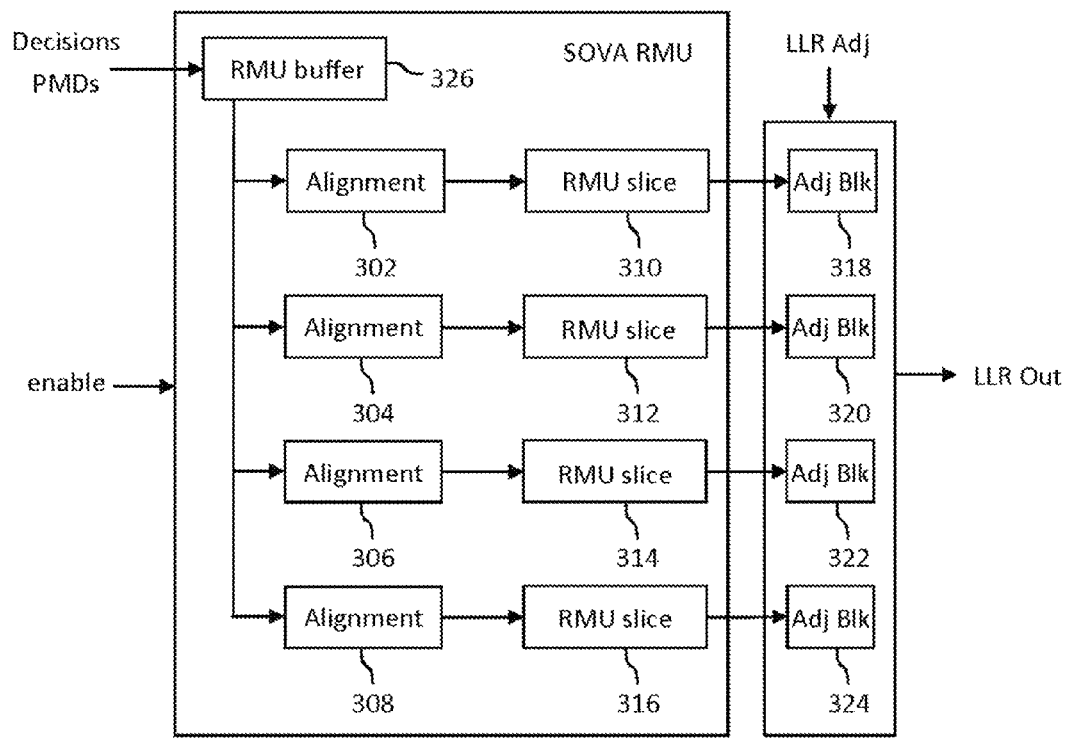
FIG. 3 is a block diagram of a RMU unit according to one embodiment of the present disclosure.

RMU 106 implements a soft Viterbi architecture algorithm with Log-Map equivalence modification to detect channel information and produce LLR used by the iterative decoder. RMU consists of two basic logic blocks: a RMU core that is made up of an input pipeline buffer and a set of four RMU pipelines and the associated alignment blocks, and an adjustment block that instantiates a set of four Log Likelihood Ratio adjustment blocks. Each core pipeline is designed such that after receiving the inputs set, the core pipeline produces one LLR bit. The different pipeline logic are exactly the same and do not share any logic. The pipeline logic is in turn made up of two basic RMU blocks. Each RMU block includes a register exchange architecture with equivalence check (REAEQ) and an eight state reliability measuring unit. The difference between the two blocks is that one uses Fossorier algorithm and the other uses the conventional reliability measuring method to produce the LLRs. The ADJ block includes some logic to perform formatting (saturation) and optionally apriori adjustment is used to produce the final LLR output. FIG. 3 is an RMU functional diagram 300.

FIG. 3 illustrates one implementation of an RMU according to the present disclosure. In this example, a RMU buffer 326 helps feed four separate pipelines. A first pipeline is formed by an alignment module 302 coupled to a RMU slice 310. RMU slice 310 can include both Fossorier stages and conventional stages. The RMU slice 310 outputs to adjustment block 318 that may adjust the signal from RMU slice 310 creating an output. A second pipeline comprising alignment module 304, RMU slice 312, and adjustment block 320 and is substantially similar to the first pipeline. A third pipeline comprising alignment module 306, RMU slice 314, and adjustment block 322 and is substantially similar to the first pipeline. A fourth pipeline comprising alignment module 308, RMU slice 316, and adjustment block 324 and is substantially similar to the first pipeline.

In some methods method, a modified RMU (mRMU) as described above is used for (<p) stages and a traditional RMU for the remainder number of stages. The motivation is to reduce the implementation cost of modified RMU which scales by the number of Viterbi states.

It is understood that initial and terminating states of a Viterbi are known, and it is important to initialize these states so that the paths are pinned during trace-back. However, the traditional method of implementing this function creates a critical path in the ACS logic. This was the motivation to develop an alternative method to perform this function without exasperating the critical path.

In one solution, an apriori-based State Metric Initialization is formed. In this method, a plurality of assumptions may be made. These assumptions include:

a. State metrics can start from any random value.

b. Assuming an 'n' tap DDNP FIR (2 in this case), there are at least 'n' equalized samples prior to the user data.

c. At least the ideal 'p' (p>=4) bits prior to the user data is known to fabricate the apriori information. This would be equivalent to the last 'p' bits of the Syncmark pattern.

While examples such as a Syncmark pattern are described herein, it is explicitly understood that any method known to one skilled in the art may be utilized.

The following sequence is then employed to initialize the state metric to a known state prior to user data:

a. Fabricate the high confidence apriori for the last 'p' bits of the Syncmark pattern.

b. Use the apriori information alone for branch metric computation for these 'p' bit times.

c. The DDNP filters will have to see the last 'n' bits of the 'p' bits to warm up its delay lines.

d. By the time the user data arrives, the best state will correspond to the last 4-bits of the Syncmark pattern.

In Apriori-based State Metric Termination, there is an assumption that it is possible to fabricate the high confidence apriori information for the pad bits. After the last user data, the branch metric computation uses the fabricated 'apriori alone' information to prune the trellis. A minimum of three pad bits is required for this operation. It is understood that the following equation (EQ. 1) may be used to determine the number of pad bits required for the use of the apriori information for a number of states (n) disclosed here:

$$\text{Number of pad bits} = \log_2(n) \qquad \text{[EQ. 1]}$$

Branch metrics that factor in apriori computation have had to keep their sign. However, one can see that if it is possible to use unsigned branch metric instead, one can reduce the width of the path metric by a single bit and help improve ACS performance.

The following method of factoring in apriori information achieves this result and provides an unsigned branch metric and therefore an unsigned path metric.

The problem that is solved relates to the timing of the DDNP parameters that drive the branch metric generation for the SOVA. This problem is quite severe when the gap between two fragments is comparable to the depth of the DDNP pipeline. This is indeed the case for high data rates. Different portions of DDNP parameters are used at different points in the DDNP pipeline. The challenge therefore is to perform an update without disrupting the pipeline and keep the parameters consistent. This problem did not exist until the continuous calibration of DDNP parameters was created.

Another embodiment of the present disclosure relates to the modifying the ACS to use unsigned operators thereby reducing the width of the path metric and optimizing the ACS critical path. Branch metrics that factor in apriori computation tends to require branch metrics to be signed. One of the innovative elements of the present disclosure is that it is possible to use unsigned branch metric instead. The use of an unsigned branch metric can reduce the width of the path metric by a single bit, thereby improving ACS performance. The following method of factoring in apriori information achieves this result and provides an unsigned branch metric and therefore an unsigned path metric. FIG. 4 is an example comprising a table 400 of this embodiment. The values within the table 400 illustrate how the method described in FIG. 5 may operate.

FIG. 5 is a flowchart 500 of one method of using unsigned values in the SOVA system. The first step in FIG. 5 is to determine the sign of the numbers that are to be used in the SOVA system (Block 502). The next step is to determine an appropriate operation for the numbers used in the SOVA system (Block 504). An operation is performed on the numbers within the SOVA system (Block 506). A comparison is performed by the SOVA system of the numbers that have been operated upon (Block 508).

The timing of the updates to DDNP parameters that drive the branch metric generation for the SOVA may be problematic. The problems created by these updates may be quite severe when the gap between two fragments is comparable to the depth of the DDNP pipeline. This is indeed the case for high data rates. Different portions of DDNP parameters are used at different points in the DDNP pipeline. The challenge therefore is to perform an update without disrupting the pipeline and keep the parameters consistent.

It is understood that this problem may be overcome by performing a rolling update of DDNP parameters with the portions updated in a pipelined lock-step manner. This presents a consistent set of parameters for a branch metric computation. In addition, the update allows for independent update of the parameters related to a single condition as and when new parameters are generated.

What is claimed is:

1. A computer-implemented method comprising:
receiving a signed number as input to a system;
using a processor,
    determining a sign of the signed number;
    determining, based on the sign of the signed number, an appropriate operation for the signed number;
    performing the appropriate operation on the signed number within the system to alter the signed number to produce an unsigned number through the use of an offset;
generating an unsigned branch metric from the unsigned number; and
outputting an unsigned path metric based on the unsigned branch metric.

2. The method of claim 1, further comprising
filtering at least one incoming signal using a data dependent noise prediction module to produce a filtered signal.

3. The method of claim 2, further comprising:
accepting the filtered signal from the data dependent noise prediction module at an add-compare-select module.

4. The method of claim 3, further comprising;
computing a best path within an a register exchange architecture using the output from the data dependent noise prediction module.

5. The method of claim 4, further comprising:
performing noise whitening using the data dependent noise prediction module.

6. The method of claim 5, wherein the noise whitening is performed through eight three-tap Finite Impulse Response (FIR) filters with polar symmetry coefficients relative to later branch metrics of the system.

7. The method of claim 5, further comprising:
performing Euclidean distance computation using the data dependent noise prediction module to produce at least one branch metric.

8. The method of claim 6, further comprising:
performing the Euclidean distance computation using sixteen branch metric units performing bias subtraction, bit shifting, and at least one square function.

9. The method of claim 8, further comprising:
employing a data flow control block within the system.

10. The method of claim 3, further comprising:
employing a reliability metric unit (RMU) within the system.

11. The method of claim 10, wherein the RMU receives an output from the add-compare-select module and generates at least one log-likelihood ratio.

* * * * *